United States Patent [19]

Huang et al.

[11] Patent Number: 5,121,184

[45] Date of Patent: Jun. 9, 1992

[54] BIPOLAR TRANSISTOR CONTAINING A SELF-ALIGNED EMITTER CONTACT AND METHOD FOR FORMING TRANSISTOR

[75] Inventors: Wen-Ling M. Huang, Phoenix, Ariz.; Kristin Brigham, Palo Alto, Calif.

[73] Assignee: Hewlett-Packard Company, Palo Alto, Calif.

[21] Appl. No.: 664,685

[22] Filed: Mar. 5, 1991

[51] Int. Cl.⁵ ............................................. H01L 29/72
[52] U.S. Cl. .......................................... 357/34; 357/54; 357/55; 357/59; 357/67; 357/68
[58] Field of Search ...................... 357/34, 54, 55, 59, 357/67, 68

[56] References Cited

U.S. PATENT DOCUMENTS

| | | | |
|---|---|---|---|
| 4,516,147 | 5/1985 | Komatsu et al. | 357/59 |
| 4,782,030 | 11/1988 | Katsumata et al. | 357/59 |
| 4,979,010 | 12/1990 | Brighton | 357/59 |

Primary Examiner—Edward J. Wojciechowicz

[57] ABSTRACT

In a process for fabricating a bipolar transistor with a single polysilicon layer, a silicon nitride layer 22 and a phospho-silicate glass layer 24 are formed on top of the polysilicon layer and the link oxide layers. The glass layer 24 has a high etch selectivity compared to the nitride layer 22 so that the glass layer may be overetched above the emitter polysilicon region without overetching the link oxide. The nitride layer is then removed by etching without significantly affecting the link oxide layer. Thus the emitter metal contact may be self-aligned on top of the emitter polysilicon region 14, 114.

13 Claims, 5 Drawing Sheets

BIPOLAR TRANSISTOR CONTAINING A SELF-ALIGNED EMITTER CONTACT AND METHOD FOR FORMING TRANSISTOR

BACKGROUND OF THE INVENTION

This invention relates in general to bipolar transistors and in particular, to a bipolar transistor structure containing a self-aligned emitter contact and method for forming the structure.

High speed bipolar transistors have been manufactured using two different processes, a two-polysilicon approach and a single-polysilicon approach. The two-polysilicon or double-polysilicon approach employs a first polysilicon layer for connecting the base region to the base metal contact. A second polysilicon layer is used to connect the emitter to the emitter metal contact. This second polysilicon layer overlaps the first polysilicon layer but is separated therefrom by an insulating layer. Such a two-polysilicon structure is illustrated, for example, in FIG. 1 of "Emitter Resistance and Performance Trade-Off of Submicrometer Self-Aligned Double-Polysilicon Bipolar Devices," by Yamaguchi et al., *IEEE* 1988 *Bipolar Circuits and Technology Meeting*, Paper 3.3, pp. 59–62. A double-polysilicon or a somewhat similar structure is also disclosed in "Self-Aligned Bipolar Transistors for High-Performance and Low-Power-Delay VLSI," by Ning et al., *IEEE Transactions on Electron Devices*, Vol. ED-28, No. 9, pp. 1010–1013, September 1981.

In the above-described two-polysilicon or double-polysilicon approach, dry etching steps are required which frequently cause radiation damage on the active regions of the transistor structure. It is therefore desirable to use a different process for manufacturing bipolar transistors. Dry etching steps are avoided in the single-polysilicon approach.

High speed submicron single-polysilicon bipolar processes have been proposed. See, for example, "STRIPE—A High-Speed VLSI Bipolar Technology Featuring Self-Aligned Single-Poly Base and Submicron Emitter Contacts," by Drowley et al., 1990 Symposium on VLSI Technology Digest of Technical Papers, June 1990, p. 53.

Another single-polysilicon approach is also disclosed, for example, in "Bipolar Transistor with Self-Aligned Lateral Profile," by Li et al., *IEEE Electron Device Letters*, Vol EDL-8, No. 8, pp. 338–340, August 1987. However, in single-polysilicon bipolar processes currently used, at least for bipolar transistors where the widths of the p-n junctions in the transistors are in the submicron range, the metal emitter contact cannot be placed directly on top of the active region for reasons explained below.

As described in the article by Drowley et al. referenced above, a Self-aligned Trench-Isolated Polysilicon Electrodes (STRIPE) transistor structure is formed. In the formation of the transistor, a trench type structure is formed over the emitter region where the trench is filled with CVD oxide. A similar trench structure is shown in FIG. 1.

The emitter metal contact in the single polysilicon approach is formed using a lithographic process which is a process requiring a minimum emitter size with certain alignment tolerances for alignment to the emitter itself. If such a metal emitter contact is to be placed directly on top of the emitter region of the transistor, the partially formed transistor structure must undergo an etching process where the CVD oxide in the trench should be completely etched to completely expose the submicron emitter. Since the lithographic process for forming the metal contact requires a minimum emitter size plus tolerances, such etching process for etching the contact oxide would frequently etch through the sidewall oxide, thereby electrically connecting the emitter and base polysilicon regions, resulting in a useless structure.

As explained above, current technology does not permit emitter metal contact to be formed on top of the emitter region. Thus in the bipolar transistor described in the above-referenced article by Li et al., the emitter metal contact is not formed directly on top of the active emitter region; instead, the emitter needs to be laterally connected to the emitter metal contact by a silicide layer. A comparison of the double-polysilicon approach to the single-polysilicon approach adopted by Li et al. above is set forth on pages 79 and 80 of "Technology and Physics of Polysilicon Emitters," by Schaber et al., IEEE, Paper 4.1, pp. 75–81, 1989.

It is known that a larger emitter resistance will cause a longer ECL-gate delay time. This is shown, for example, in FIG. 5 of the paper by Yamaguchi et al. referenced above. For this reason, using a silicide layer to laterally connect the emitter polysilicon to the emitter metal contact instead of forming the contact directly on top of the emitter region increases the emitter resistance, thereby also increasing the ECL-gate delay. It is therefore desirable to provide a bipolar transistor where the emitter metal contact is formed directly on top of the active emitter region and a method for manufacturing such structure.

SUMMARY OF THE INVENTION

This invention is based on the observation that if the CVD oxide used to fill the trench in the STRIPE structure described above, or in other single polysilicon structures described below, is replaced by two or more layers with different selectivity in etching, it is possible to overetch (defined below) such layers without etching through the sidewall oxide which would create an electrical short between the emitter and base polysilicon layers.

The bipolar transistor structure of this invention includes a silicon substrate, a layer of polysilicon on selected portions of the substrate to form emitter, base and collector polysilicon regions, and silicon oxide layers on both sides of and in contact with the emitter polysilicon region. The structure also includes a silicon nitride layer on portions of the oxide layers, a doped glass layer on said silicon nitride layer and a metal material in contact with the polysilicon layer in the emitter polysilicon region to form the emitter contact.

To form the above-described structure, the method of this invention begins with a structure where the single polysilicon layer has been formed on selected regions of a silicon substrate and after the sidewall oxide layer has been formed. The method includes the steps of depositing a layer of silicon nitride onto the oxide layer and the polysilicon layer in the emitter polysilicon region, depositing a layer of doped glass onto the silicon nitride layer and depositing a layer of photoresist onto the doped glass layer except for a predetermined area over the emitter polysilicon region. The method further comprises the steps of directionally etching away all of the doped glass layer and some of the nitride layer in a predetermined area over the emitter polysilicon region, directionally etching away all of the nitride layer in said predetermined area over the emitter polysilicon region and depositing a metal material into said predetermined area to form the emitter contact.

DETAILED DESCRIPTION OF THE INVENTION

Figure 1:
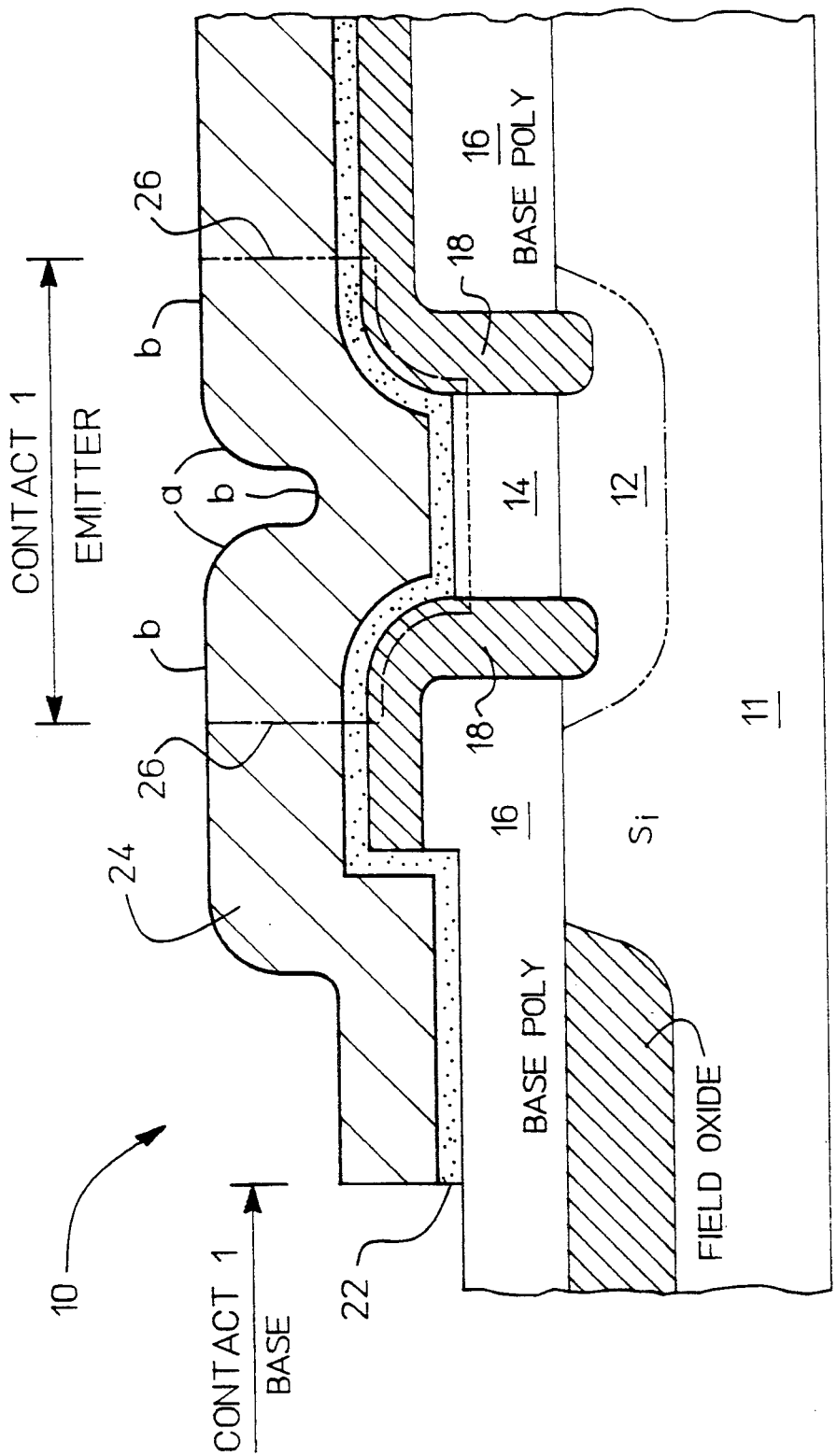
FIG. 1 is a cross-sectional view of a semiconductor structure fabricated using a single polysilicon approach for self-aligning the emitter metal contact with the emitter region for constructing a STRIPE device to illustrate the invention.

FIG. 1 is a cross-sectional view of a semiconductor structure useful for fabricating a STRIPE-type transistor where the emitter metal contact is self-aligned with the emitter region useful to illustrate the invention. As shown in FIG. 1, structure 10 includes a silicon substrate 11 wherein the active emitter, base and collector regions (not shown in FIG. 1) have already been formed in the general area marked "12." Structure 10 includes a polysilicon layer divided into three sections for connecting the active emitter, base and collector regions to their respective contacts. Only two such sections are shown in FIG. 1. As shown in FIG. 1, the section of polysilicon layer 14 is used to contact the emitter region in area 12 to the emitter contact, and polysilicon layer section 16 is used to contact the base region in area 12 to the base contact. The section of the polysilicon layer for contacting the collector region to the collector contact is not shown in FIG. 1, nor is the subcollector region underneath area 12 for connecting the collector in area 12 to the collector polysilicon layer. The emitter and base polysilicon sections 14, 16 are separated by portions of a layer 18 of sidewall or link silicon oxide in order to electrically isolate the emitter polysilicon from the base polysilicon.

On top of the link oxide layer 18 and the polysilicon sections 14, 16 is deposited a layer of silicon nitride 22 and on top of the nitride layer a layer of doped glass 24. In conventional single polysilicon approaches, the nitride and doped glass layers are replaced instead by a silicon oxide layer.

It is known to those skilled in the art that, in order to improve the speed performance of the bipolar transistor, it is desirable to reduce the widths of the p-n junctions forming the transistor. For this reason, the width of the emitter polysilicon section 14 is of the minimum value permitted by current lithographic processes. The emitter metal contact is formed using a lithographic process which is a process requiring a minimum emitter contact width plus certain alignment tolerances, which results in a minimum emitter metal contact width (such as, for example, the distance between dotted lines 26 in FIG. 1) that is wider than the width of the emitter polysilicon section, such as section 14. Thus as shown in FIG. 1, the width of the emitter contact is much wider than the width of the emitter polysilicon section 14. The area between the link oxide layers 18 and section 14 forms a trench-shaped structure.

In conventional single polysilicon approach, the trench is filled by silicon oxide. In order to form the contact, the section of the silicon oxide within the dotted lines 26 must be etched away and be replaced by a metal to form the emitter contact. As shown in FIG. 1, the section of the material bounded by the dotted line 26 has a shoulder a where the depth of the material in the trench is much thicker than that at the flat portions b. The process for removing the material within the boundary is normally a directional etching process so that a much longer time will be required to remove all of the material within the trench at shoulder a rather than at the flat portion b. All of the material in the trench should be etched away, including the material at the corners c; otherwise, the material left at corners c will reduce the width of the contact between the emitter polysilicon section 14 and the emitter contact, which is undesirable. Therefore, in conventional fabrication process, overetching is employed, as explained below.

In overetching, if time T is required to etch away the layer of material within boundary 26 at a flat portion b, an extra fraction or percentage of the time period T will be employed to etch away the material in the trench, including that at corners c. In conventional single polysilicon approach, however, such overetching would typically etch through the link oxide layers 18 so that when the etched material is replaced by a metal, the emitter polysilicon section 14 and the base polysilicon sections 16 will be electrically connected, thereby creating an electrical short between the emitter and base regions of the transistor. Needless to say, the resulting structure is useless. For this reason, in single polysilicon approaches that have been proposed, such as by Lee et al. described above, the emitter metal contact is not self-aligned on top of the emitter region.

The above-described problem in overetching is exacerbated by the difficulty in pattern alignment for the directional etching process for removing the silicon oxide with the emitter polysilicon section 14. Thus even if the emitter polysilicon section 14 is larger than shown in FIG. 1, overetching can still cause an electrical short between the base and emitter polysilicon sections when the directional etchings is misaligned with respect to the emitter polysilicon section 14.

This invention is based on the observation that the above-described problem can be avoided altogether by replacing the silicon oxide material by a silicon nitride layer and a doped glass layer for filling the trench between the link oxide layers 18 and emitter polysilicon section 14. This is illustrated in FIG. 1. First a layer of silicon nitride is deposited onto the link oxide layers 18 and the polysilicon sections 14 and 16 as shown in FIG. 1. Then a layer of doped glass 24 is deposited onto the nitride layer 22.

Figure 2:
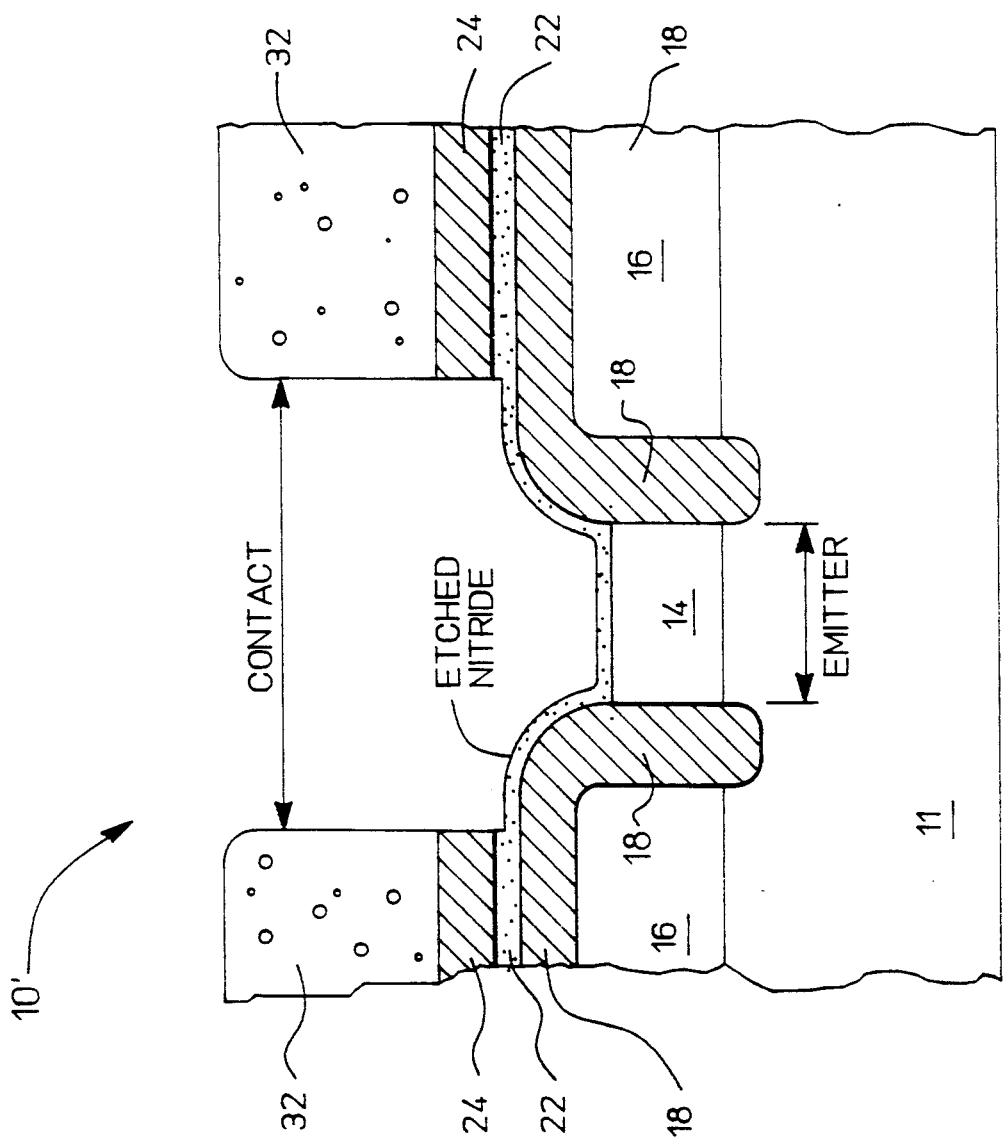
FIGS. 2, 3 are cross-sectional views of semiconductor structures to illustrate a sequence of process for fabricating the STRIPE-type device of the preferred embodiment of the invention.
Figure 3:
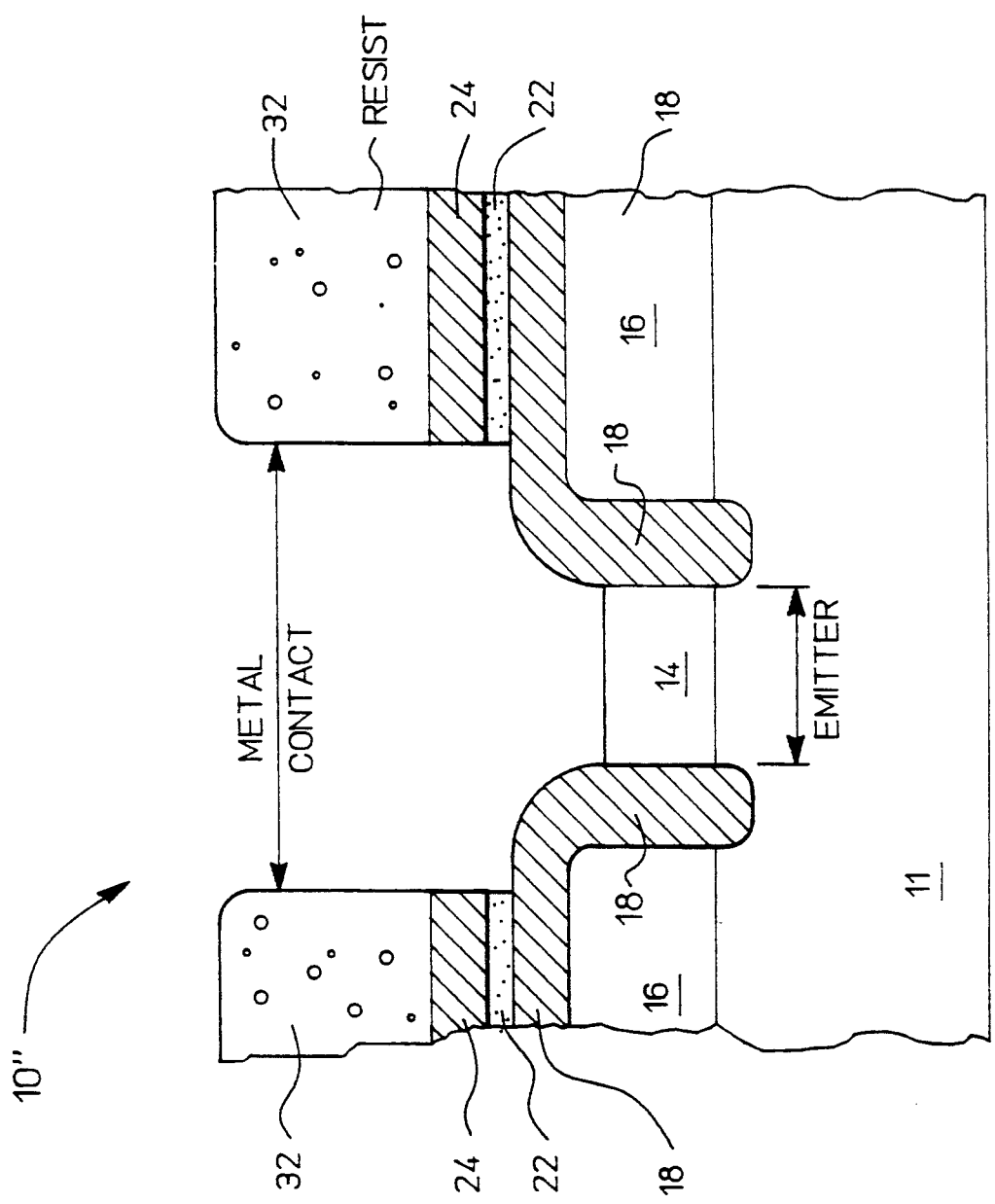

To form a metal contact directly on top of the emitter region, it would be desirable to remove the portion of the nitride and doped glass on top of the emitter polysilicon section 14 and portions of the link oxide 18 where the portion of the nitride and doped glass to be removed are within dotted line "26." The subsequent steps for forming the emitter metal contact are illustrated in FIGS. 2 and 3.

As shown in FIG. 2, a photoresist layer 32 is formed on top of the doped glass layer 24, leaving an area of the doped glass layer exposed where the metal contact is to be formed. Directional etching is then performed on the exposed doped glass layer 24 to etch away all of the doped glass layer and a portion of the nitride layer 22. The doped glass layer is appropriately doped with a suitable dopant such as phosphorous to attain sufficient etch selectivity compared to silicon nitride. Glass doped with 8% phosphorous has been found to be suitable. At such percentage of doping, the etch selectivity of PSG (phospho-silicate glass) to a silicon nitride is about 7:1; this means that the etch rate of PSG is about seven times that of silicon nitride. Hence even though the silicon nitride layer is much thinner than that of the PSG as illustrated in FIGS. 1 and 2, the entire PSG layer is etched away while only a portion of the nitride layer is etched, resulting in the structure shown in FIG. 2. The directional etching of the PSG and nitride layers is conventional and is known to those skilled in the art.

Figure 4:
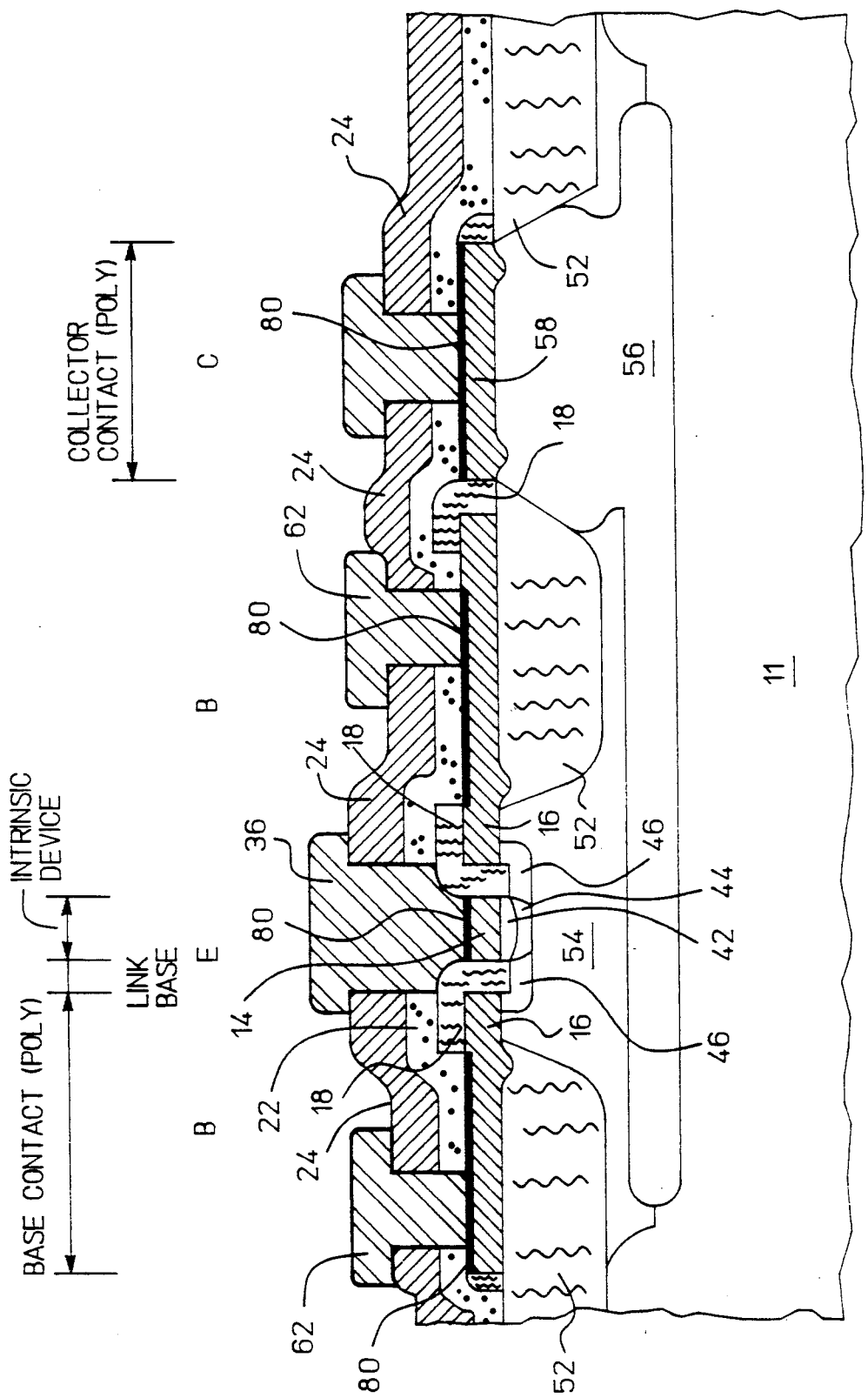
FIG. 4 is a cross-sectional view of a STRIPE-type transistor fabricated using the method of FIGS. 2, 3.

After the above-described etching process, the remaining nitride layer left in structure 10' in FIG. 2 is etched away as shown in FIG. 3. The photoresist layer 32 is removed and the trench left between the PSG, nitride and link oxide layers is then filled with a metal material to form the emitter metal contact 36 as shown in FIG. 4. FIG. 4 is a cross-sectional view of the completed bipolar transistor structure using the single polysilicon approach of this invention. Also shown in FIG. 4 are the emitter n region 42, the base p region 44, and the link base p+regions 46 connecting the base region 44 to the base polysilicon sections 16. Below base region 44 and between the field oxide layers 52 is the collector n region 54. Thus the emitter region 42 is connected through the emitter polysilicon section 14 to the emitter metal contact 36. The base region 44 is connected through the link base regions 46 and the base polysilicon sections 16 to the base contacts 62. The collector region 54 is connected through the heavily doped subcollector n+ + region 56, collector polysilicon section 58 to collector metal contact 64.

In the above-described single polysilicon process, self-alignment of the emitter metal contact to the emitter region is achieved without etching through the link oxide layers 18. This is achieved by making use of the etch selectivity between the doped glass layer and the silicon nitride layer. Since the PSG layer has a much higher etch rate compared to the silicon nitride layer, overetching the PSG layer will not affect the link oxide layer 18. As shown in FIG. 2, all of the PSG layer may be removed in a overetching process while leaving a thin layer of nitride to protect the link oxide layer 18 and the emitter polysilicon layer 14. The thickness of the PSG layer is designed to be the minimum needed for isolation between the emitter metal contact and the base polysilicon, and may be within a range of 2,500–5,000 Angstroms. The thickness of the silicon nitride is designed to be the minimum needed to protect the emitter polysilicon layer and link oxide layer during the process in etching and overetching the PSG layer, while allowing all the nitride to be removed during the subsequent etch without significantly etching into the link oxide layer. The silicon nitride layer may be of a thickness within the range of about 750–1,500 Angstroms.

For the doped glass layer 24, glass doped with 8% phosphorous is found to be suitable. A lower percentage of phosphorous doping is found to have less etch selectivity to nitride for the same etch condition than desirable. The etch selectivity of PSG to nitride can be increased by increasing the percentage of phosphorous; however, higher percentage of phosphorous doping causes the doped glass to be more susceptible to moisture absorption, forming phosphoric acid which attacks aluminum, and is therefore undesirable.

The silicon nitride layer may be deposited by LPCVD process at about 750° C. or plasma-enhanced CVD process at about 400° C. Plasma-enhanced CVD nitride has worse etch selectivity to PSG than LPCVD nitride and a lower bias etch (typically 400 volts) is used as compared to LPCVD nitride (typically 450 volts).

Where the PSG layer is 3,000 Angstroms thick, the PSG layer should be removed by an overetch which is about 90%. Where the PSG layer is only 2,500 Angstroms thick, the overetch is about 60%. The higher the percentage of overetch needed, the thicker the nitride layer should be or a better etch selectivity between PSG and nitride is needed.

To reduce resistances in the bipolar transistor structure of FIG. 4, a silicide layer 80 is formed on portions of the emitter, base and collector polysilicon sections 14, 16 and 58. This is usually performed by sputtering platinum onto the structure. After platinum silicide is formed, the excess platinum is removed with a wet etch. Platinum silicide breaks down at temperatures above about 500° C. Thus where selected portions of the polysilicon is silicided, only the plasma-enhanced CVD nitride can be used since silicides would degrade at the higher temperature for depositing the nitride using the LPCVD process. Then after the silicide layer has been formed, the subsequent deposition of the nitride layer will not cause the silicide layer to break down. If no silicidation is performed for the transistor structure of FIG. 4, the nitride is preferably deposited by means of the LPCVD process because of its better etch selectivity compared to PSG. Whereas silicidation is performed, it is preferable to do so before the nitride layer is deposited; otherwise, large portions of the polysilicon surface of sections 16 and 58 would have been covered by the nitride layer so that the subsequent silicidation would not significantly reduce resistances for the transistor. Titanium silicide may be used instead of platinum silicide; titanium silicide breaks down at temperatures above about 800° C.

Figure 5:
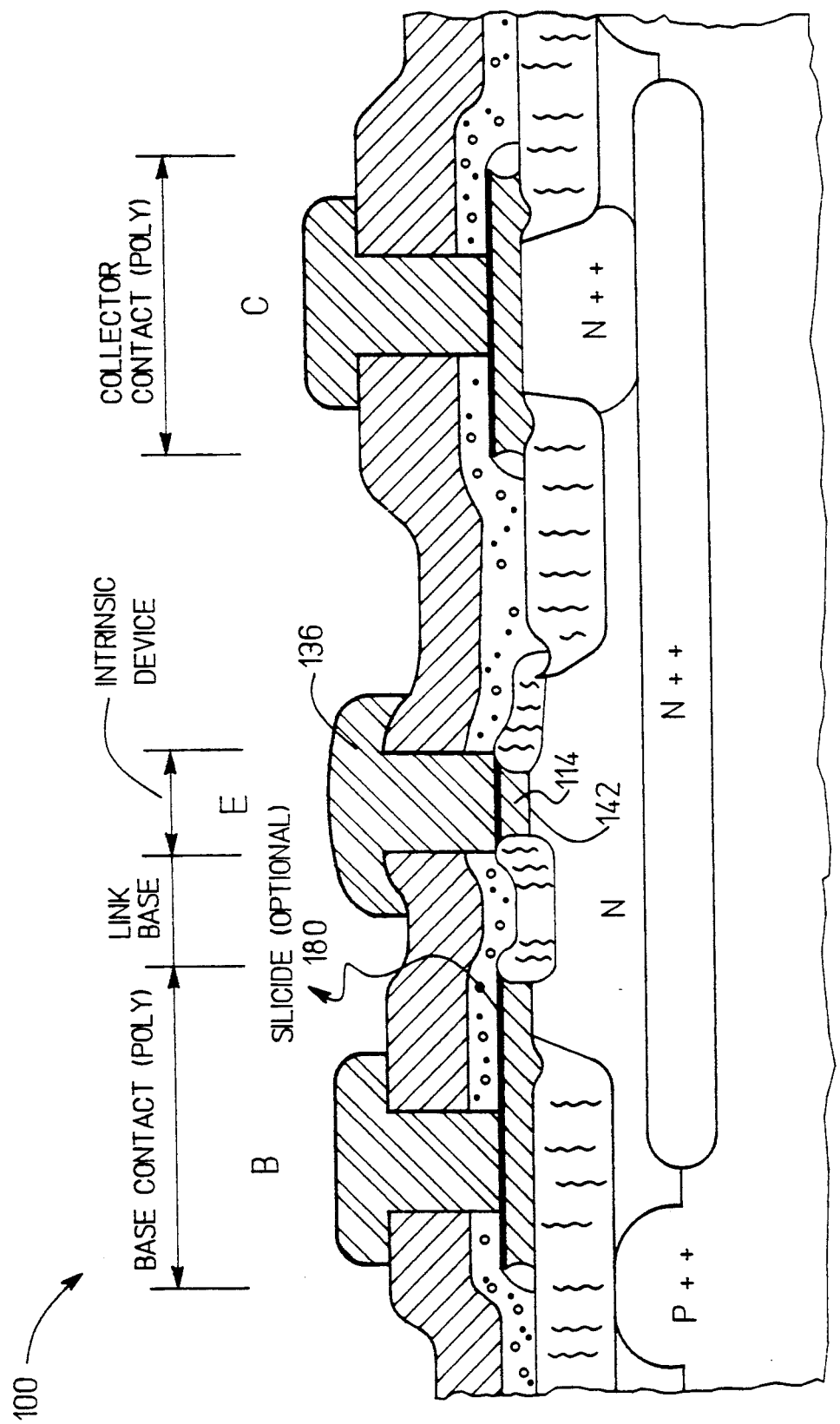
FIG. 5 is a cross-sectional view of a bipolar transistor fabricated with a single polysilicon approach to illustrate an alternative embodiment of the invention.

The above-described process using PSG and nitride is equally applicable for the non-STRIPE type bipolar transistor structure 100 of FIG. 5. The above-described method of forming a metal emitter contact may be used for forming the emitter metal contact 136 on top of the emitter region 142 and emitter polysilicon section 114. Again an optional silicide layer 180 may be formed to reduce resistances.

The invention has been described above by reference to particular structures and preferred embodiments. It will be understood that various modifications may be made to the structure and method without departing from the scope of the invention which is to be limited only by the appended claims.

What is claimed is:

1. A bipolar transistor structure comprising:
   a silicon substrate;
   a layer of polysilicon on selected portions of the substrate to form emitter, base and collector polysilicon regions;
   silicon oxide layers at opposed ends of and in contact with the emitter polysilicon region;
   a silicon nitride layer on portions of the oxide layers;
   a doped glass layer on said silicon nitride layer; and
   a metal material in contact with the polysilicon layer in the emitter polysilicon region between the silicon oxide layers, thereby forming an emitter contact.

2. The structure of claim 1, further comprising:
metal contacts on at least portions of the base and collector polysilicon to form base and collector contacts, wherein said nitride and doped glass layers extend between the base, emitter and collector contacts.

3. The structure of claim 2, further comprising a layer of silicide of a metal between selected portions of the polysilicon layer and the metal contacts for reducing the resistance of the base, emitter or collector of the transistor.

4. The structure of claim 1, wherein the nitride layer has a thickness in the range of about 750–1,500 Angstroms.

5. The structure of claim 1, wherein the doped glass layer has a thickness in the range of about 2,500–5,000 Angstroms.

6. The structure of claim 1, wherein the doped glass layer contains glass doped with phosphorus.

7. The structure of claim 1, wherein the doped glass layer contains glass doped with phosphorus and boron.

8. The structure of claim 1, wherein the doped glass layer contains about 8% phosphorus.

9. The structure of claim 1 wherein the emitter contact has portions extending over the doped glass layer, the portions being spaced apart from the silicon oxide layer by the doped glass layer and the silicon nitride layer.

10. A bipolar transistor structure comprising:
a silicon substrate having an emitter region;
a single layer of polysilicon having polysilicon segments atop selected regions of the silicon substrate, including an emitter polysilicon segment on the emitter region;
a silicon oxide layer at opposed ends of the emitter polysilicon segment;
a silicon nitride layer on the silicon oxide layer;
a doped glass layer on the silicon nitride layer; and
a metal emitter contact disposed directly above the emitter region and in electrical communication with the emitter region via the emitter polysilicon segment.

11. The structure of claim 10 wherein the metal emitter contact has portions extending atop the doped glass layer, the portions thereby spaced apart from the silicon oxide layer by the doped glass layer and the silicon nitride layer.

12. The structure of claim 10 wherein the metal emitter contact extends into and is in contact with each of the layers of doped glass, silicon nitride and silicon oxide.

13. The structure of claim 10 wherein the doped glass layer has a concentration of phosphorous.

* * * * *